United States Patent [19]

Jones

[11] Patent Number: 4,631,808

[45] Date of Patent: Dec. 30, 1986

[54] METHOD OF FORMING A SUPERCONDUCTIVE JOINT BETWEEN MULTIFILAMENT SUPERCONDUCTORS

[75] Inventor: Donald W. Jones, Burnt Hills, N.Y.

[73] Assignee: General Electric Company, Schenectady, N.Y.

[21] Appl. No.: 530,926

[22] Filed: Sep. 12, 1983

[51] Int. Cl.⁴ .......................................... H01L 39/24
[52] U.S. Cl. ....................................... 29/599; 29/518; 29/871; 29/872; 174/15 C; 174/84 C; 174/128 S
[58] Field of Search ................. 29/599, 871, 872, 518; 174/84 C, 15 C, 15 S, 126 S, 128 S

[56] References Cited

U.S. PATENT DOCUMENTS

| | | | |
|---|---|---|---|
| 584,299 | 6/1897 | Weldon | 29/518 |
| 2,803,695 | 8/1957 | Woolley, Jr. | 29/871 X |
| 3,422,529 | 1/1969 | Nuding | 29/599 |
| 3,538,596 | 11/1970 | Davis et al. | 29/872 |
| 3,908,267 | 9/1975 | Loyd et al. | 29/872 |
| 4,268,957 | 5/1981 | Sbuelz | 29/871 |

FOREIGN PATENT DOCUMENTS

80/02084  10/1980  PCT Int'l Appl. .................. 29/871

Primary Examiner—Howard N. Goldberg
Assistant Examiner—Vernon K. Rising
Attorney, Agent, or Firm—Lawrence D. Cutter; James C. Davis, Jr.; Marvin Snyder

[57] ABSTRACT

Superconductive conductors, having as many as thousands of filaments, are joined together to form a true superconductive joint. The method is particularly applicable in the situation in which superconductive filaments are embedded in an overlying or surrounding matrix of resistive material such as copper or aluminum. The resistive material is removed by chemical dissolution to expose a length of superconductive filaments. The filaments are juxtaposed within a sleeve of superconductive material which is crimped about the exposed filaments. The connection may be completed by thermally fusing the exposed ends of the filaments.

11 Claims, 4 Drawing Figures

METHOD OF FORMING A SUPERCONDUCTIVE JOINT BETWEEN MULTIFILAMENT SUPERCONDUCTORS

BACKGROUND OF THE INVENTION

This invention is related to methods for forming superconductive joints; more particularly, the present invention is directed to methods for forming superconductive joints between superconductors having as many as thousands of wire filaments.

In whole body, nuclear magnetic resonance (NMR) imaging systems, it is necessary to provide a high strength, uniform magnetic field, typically between about 0.04 and 1.5 Tesla, or more. A desirable means for providing this field employs superconductive coil circuits operating in the persistent mode. This method for producing such magnetic fields is desirable in that continual supply of electrical energy to the coils is not required. However, such circuits must typically carry current at a high level of current density, typically 10,000 amperes/$cm^2$, or more. To insure that such circuits do not spontaneously exhibit localized resistive (or ohmic) regions which leads to quenching of the current, it is necessary to provide sound superconductive joints on various portions of the current loop. Furthermore, because of the high levels of current employed, it is highly desirable to employ superconductive conductors having a composite structure. The composite structure typically takes a form in which a large plurality of superconductive strands or filaments are disposed within an overlaying or surrounding matrix of normal, resistive material such as copper or aluminum. Typically the copper or aluminum matrix provides an alternate, localized current path in the event that a small portion of the superconductive wire exhibits a transition to the resistive (ohmic) state. Such a composite structure is desired because of the relatively large current density desired in NMR imaging. It should also be understood that the superconductors and composite superconductors described herein are typically disposed within a coolant bath, such as liquid helium, so as to keep their temperature in the vicinity of 4.2° K. to maintain the superconductive material in the zero resistance state.

Two methods have heretofore been used to produce superconductive joints. In a first of these methods, individual superconductive filaments, after stripping of the surrounding matrix, are individually spot welded to an intermediate niobium foil. However, this method is impractical when hundreds or thousands of filaments are to be joined. Unfortunately, modern composite superconductive conductors often employ thousands of filaments in their construction. Since such conductors are desirable in the coils for NMR imaging systems, this method of superconductive joint formation is therefore highly undesirable from a manufacturing view point. In a second method, bundles of superconductive filaments from which the surrounding matrix has been stripped, are crimped together in a copper sleeve. However, this method of joint formation has not been demonstrated to work with a strand of more than one or two hundred filaments. Thus, this method is also seen to be undesirable for the construction of the main magnetic field coils for NMR imaging systems.

Accordingly, it is seen that it is highly desirable to be able to join together superconducting conductors having between 200 and 2,000 filaments (or more) together in a way in which a sound truly superconductive joint is formed. It is further seen that this joint should be capable of long term operation in a low temperature coolant bath and be constructed so that it does not exhibit a tendency for transition to the normal, resistive state particularly as a result of microscopic filament motion.

SUMMARY OF THE INVENTION

In accordance with a preferred embodiment of the present invention a method of joining one or more superconductive conductors embedded in a resistive matrix comprises the steps of removing the resistive matrix from a length of superconductive conductors to form exposed ends of superconductive filaments; and then juxtaposing the exposed filaments in a sleeve of superconducting material and crimping the sleeve about the exposed filaments. Thermal fusion of the exposed ends of the conductors may then be performed, if desired. In a particularly preferred embodiment of the present invention the sleeve comprises a superconductive material such as a niobium-titanium alloy and the thermal fusing, if desired, is accomplished by means of tungsten-inert-gas welding. The superconductive conductors or filaments typically and preferably comprise an alloy of niobium and titanium although other superconductive materials may be employed. The surrounding resistive matrix typically comprises either copper or aluminum. The superconductive joint formed as above may also be disposed within a quantity of material such as indium disposed within a copper cup surrounding the crimped sleeve.

Accordingly, it is an object of the present invention to provide a method for forming superconductive joints between multifilament superconductors.

It is also an object of the present invention to provide a method for joining niobium-titanium alloy superconductors.

It is a still further object of the present invention to provide a superconductive joint which is particularly useful in NMR imaging systems or in circuits in which high current densities are desired.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
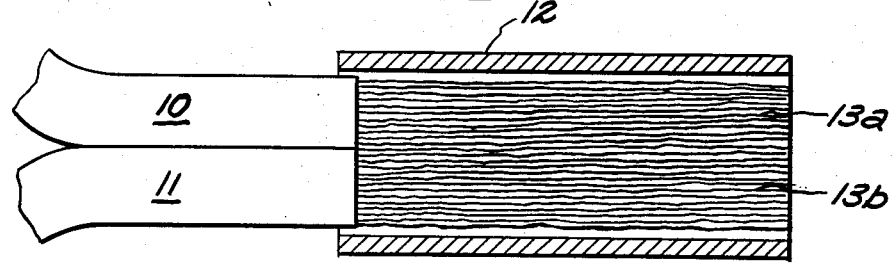
FIG. 1 is a partial cross-sectional side elevation view illustrating the method of the present invention prior to crimping of the sleeve.

FIG. 1 particularly illustrates the initial step of the present invention. In particular, there is shown superconductive conductors 10 and 11 from which the surrounding matrix of resistive material has been stripped so as to form strands of filaments 13a and 13b extending from composite conductors 10 and 11, respectively. Cylindrical sleeve 12 is disposed about filaments 13a and 13b, and is preferably disposed so as to extend over at least a portion of the composite (unstripped) conductors. While, in FIG. 1, composite conductors 10 and 11 are shown as being disposed within the same end of sleeve 12, it is also possible to have conductors 10 and 11 disposed at opposite ends of sleeve 12. Sleeve 12 preferably comprises a superconductive material such as niobium-titanium alloy. Filaments 13a and 13b comprise the structure which is remaining when composite superconductors 10 and 11 respectively have been stripped of the surrounding resistive matrix material. This matrix material typically comprises copper or aluminum. The matrix material is removed by chemical dissolution, such as by immersing the ends of composite conductors 10 and 11 in a selective etchant such as nitric acid.

Figure 2:
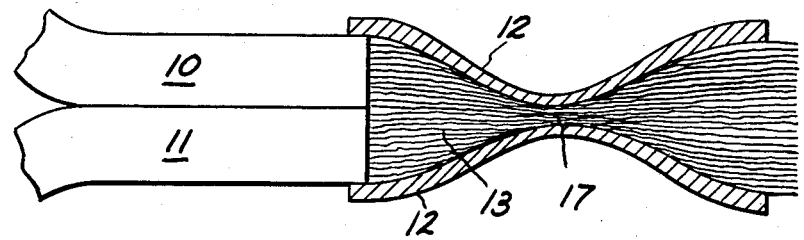
FIG. 2 is a view similar to FIG. 1 illustrating crimping of the sleeve.
Figure 3:
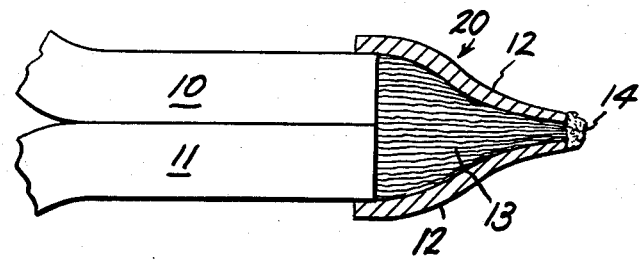
FIG. 3 is a view similar to FIG. 2 illustrating the fusing of the superconductive filaments to the sleeve.

FIG. 2 illustrates another step in the method of the present invention, and in particular the step in which sleeve 12 is crimped about filaments 13a and 13b so as to form a single filamentary bundle 13. Crimping results in a gross cold flow forming pinch-off region 17. The sleeve and filaments extending beyond pinch-off region 17 are then preferably severed. The filamentary bundle, which typically comprises filaments of niobium-titanium alloy, may, if desired, be thermally fused at its end to sleeve 12 thereby forming weld 14. The thermal fusion, when employed, is preferably accomplished by a method such as tungsten-inert gas (TIG) welding. This results in the structure of the present invention illustrated in FIG. 3.

Figure 4:
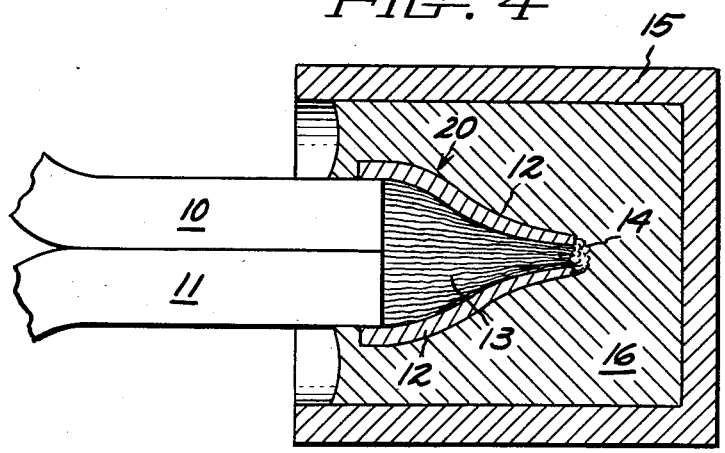
FIG. 4 is a view similar to FIG. 3 showing the joint disposed within a quantity of material such as indium.

FIG. 4 illustrates a final step that may be employed in the method of the present invention. In particular, there is shown crimped and welded joint 20 disposed within a quantity of low melting point metal 16 such as indium. Conductive material 16 is in turn disposed within cup 15 surrounding crimped sleeve 12. The placement of joint 20 in the indium, which is solid at the cryogenic temperatures employed, provides added physical strength and rigidity to the structure, a shunt current path in the event that the joint should be forced into the normal conducting mode, and protection of the fine filaments from corrosive contaminants.

From the above, it may be appreciated that the method of the present invention provides a physically rigid, sound superconductive joint. It is also seen that the present invention provides a method for joining composite superconductive materials even when the composite conductors include thousands of superconductive filaments. It is also seen that the superconductive joint of the present invention is also particularly useful in NMR imaging systems in which the persistent current magnet coils carry high levels of current in which the current density is large. However, the present invention is not limited solely to NMR imaging systems and may in fact be employed in any situation in which it is desired to join multifilament, composite superconductors.

While the invention has been described in detail herein, in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of joining at least two super-conductive conductors in which a plurality of superconductive filaments are embedded in a resistive matrix, said method comprising the steps of:
   removing said resistive matrix from along a length of said at least two superconductive conductors at the ends thereof to expose said superconductive filaments;
   juxtaposing said exposed superconductive conductors in a sleeve of supconductive material;
   crimping said sleeve about said exposed superconductive filaments so as to produce a pinchoff region in said sleeve;
   severing said sleeve at said pinchoff; and thermally fusing the exposed ends of said superconductive filaments to said sleeve.

2. The method of claim 1 in which each superconductive conductor to be joined includes between about 200 and 2,000 superconductive filaments.

3. The method of claim 1 in which said sleeve is positioned prior to crimping so as to overlap at least a portion of said superconductive conductors from which the resistive matrix has not been removed.

4. The method of claim 1 in which said thermal fusing is accomplished by tungsten-inert-gas welding.

5. The method of claim 1 in which said superconductive filaments comprise an alloy of niobium and titanium.

6. The method of claim 1 in which a said superconductive sleeve comprises niobium.

7. The method of claim 1 in which said resistive matrix comprises material selected from the group consisting of copper and aluminum.

8. The method of claim 1 further including the step of disposing said fused end in material comprising indium.

9. The method of claim 8 in which said indium is disposed in a vessel surrounding said crimped sleeve.

10. The method of claim 9 in which said vessel comprises copper.

11. A method of joining at least two bundles of superconductive filamentary conductors, said method comprising the steps of:
   juxtaposing said filamentary superconductors in a sleeve of superconductive material;
   crimping said sleeve about said filamentary superconductive conductors so as to produce a pinchoff region in said sleeve;
   severing said sleeve at said pinchoff; and
   thermally fusing the exposed ends of said filamentary superconductive conductors to said sleeve.

* * * * *